US009348232B2

(12) United States Patent
Horn et al.

(10) Patent No.: US 9,348,232 B2
(45) Date of Patent: May 24, 2016

(54) ILLUMINATION SYSTEM FOR A MICROLITHOGRAPHIC PROJECTION EXPOSURE APPARATUS

(75) Inventors: Jan Horn, Munich (DE); Christian Kempter, Wittislingen (DE); Wolfgang Fallot-Burghardt, Bad Dürkheim (DE)

(73) Assignee: Carl Zeiss SMT GmbH, Oberkochen (DE)

(*) Notice: Subject to any disclaimer, the term of this patent is extended or adjusted under 35 U.S.C. 154(b) by 1218 days.

(21) Appl. No.: 12/797,188

(22) Filed: Jun. 9, 2010

(65) Prior Publication Data

US 2010/0309449 A1 Dec. 9, 2010

Related U.S. Application Data

(63) Continuation of application No. PCT/EP2008/010918, filed on Dec. 19, 2008.

(60) Provisional application No. 61/016,105, filed on Dec. 21, 2007.

(51) Int. Cl.
*G03B 27/42* (2006.01)
*G03F 7/20* (2006.01)

(52) U.S. Cl.
CPC .................................. *G03F 7/70116* (2013.01)

(58) Field of Classification Search
CPC ............ G03F 7/70291; G03F 7/70516; G03F 7/70425; G03F 7/704; G03F 7/70508; G03F 7/20; G03F 7/2051; G03F 7/22; G03F 7/70116; G03F 7/702; G03F 7/70383; G03F 9/70

USPC .............................. 355/53, 55, 63, 67, 72, 77
See application file for complete search history.

(56) References Cited

U.S. PATENT DOCUMENTS

| | | |
|---|---|---|
| 5,270,716 A | 12/1993 | Gleim |
| 6,549,155 B1 | 4/2003 | Heminger et al. |
| 6,940,629 B2 | 9/2005 | Gurcan |

(Continued)

FOREIGN PATENT DOCUMENTS

| | | |
|---|---|---|
| CN | 1292102 | 4/2001 |
| DE | 39 16 202 | 11/1990 |
| JP | S 51-126194 | 11/1976 |
| JP | 2001-090587 | 4/2001 |
| WO | WO 99/45441 | 9/1999 |

OTHER PUBLICATIONS

International Search Report for the corresponding PCT Application No. PCT/EP2008/010918, filed Dec. 19, 2008.

(Continued)

*Primary Examiner* — Mesfin T Asfaw
(74) *Attorney, Agent, or Firm* — Fish & Richardson P.C.

(57) ABSTRACT

An illumination system for a microlithographic projection exposure apparatus includes a mirror arranged in a multi-mirror array and capable of being tilted via at least one actuator. The illumination system also includes drive electronics, which include a coarse digital-to-analogue converter with a first resolution, and a fine digital-to-analogue converter with a second resolution, and an adder. The second resolution is higher than the first resolution. The adder can add output quantities that are output by the two digital-to-analogue converters to yield an overall quantity that is capable of being applied at least indirectly to the at least one actuator of the mirror.

26 Claims, 9 Drawing Sheets

(56) References Cited

U.S. PATENT DOCUMENTS

2002/0101769 A1* 8/2002 Garverick et al. ............ 365/200
2004/0179257 A1* 9/2004 Gurcan ......................... 359/290
2005/0057746 A1* 3/2005 Takahashi et al. ....... 356/139.07
2007/0252967 A1* 11/2007 Bleeker et al. ................. 355/67
2008/0024745 A1* 1/2008 Baselmans et al. ............ 355/67
2008/0079930 A1* 4/2008 Klarenbeek .................. 356/121
2008/0239268 A1* 10/2008 Mulder et al. ................. 355/67

OTHER PUBLICATIONS

Chinese Office Action, with translation thereof, for CN Appl No. 201210586425.6, dated May 6, 2014.
Japanese Office Action, with translation thereof, for JP Appl No. 2010-538480, dated Jan. 29, 2014.

* cited by examiner

ILLUMINATION SYSTEM FOR A MICROLITHOGRAPHIC PROJECTION EXPOSURE APPARATUS

CROSS-REFERENCE TO RELATED APPLICATIONS

This application is a continuation of, and claims benefit under 35 USC 120 to, international application PCT/EP2008/010918, filed Dec. 19, 2008, which claims benefit to U.S. Provisional Application No. 61/016,105, filed Dec. 21, 2007. International application PCT/EP2008/010918 is hereby incorporated by reference in its entirety.

FIELD

The disclosure relates to an illumination system for a microlithographic projection exposure apparatus with a mirror which is arranged in a multi-mirror array and is capable of being tilted via at least one actuator, and with drive electronics for the mirror, and also to methods for driving the mirror.

BACKGROUND

Integrated electrical circuits and other microstructured components are conventionally manufactured by several structured layers being applied onto a suitable substrate, which may be, for example, a silicon wafer. For the purpose of structuring the layers, the latter are firstly covered with a photoresist that is sensitive to light pertaining to a certain wavelength region—for example, light in the deep ultraviolet spectral region (DUV). Subsequently the wafer that has been coated in this way is exposed in a microlithographic projection exposure apparatus. In this process a pattern of structures which is arranged on a mask is imaged onto the photoresist with the aid of a projection objective. Since the reproduction scale in this process is generally less than 1, projection objectives of such a type are frequently also designated as reduction objectives.

After the photoresist has been developed, the wafer is subjected to an etching process, as a result of which the layer is structured in accordance with the pattern on the mask. The photoresist left behind is then removed from the remaining parts of the layer. This process is repeated until all the layers have been applied onto the wafer.

The performance of the projection exposure apparatus that are used is determined not only by the imaging properties of the projection objective but also by an illumination system that illuminates the mask with the projection light. For this purpose the illumination system contains a light source, for example a laser operated in pulsed mode, as well as several optical elements which generate, from the light generated by the light source, light bundles that converge on the mask at field points. In this connection the light bundle desirably has certain properties, which in general are matched to the projection objective.

These properties include, inter alia, the angular distribution of the light bundles which each converge to a point in the mask plane. The term 'angular distribution' describes how the total intensity of a light bundle is distributed to the different directions from which the individual rays of the light bundle impinge on the relevant point in the mask plane. If the angular distribution is specially adapted to the pattern contained in the mask, the pattern can be imaged onto the wafer covered with photoresist with higher imaging quality.

In illumination systems for microlithographic projection exposure apparatus the use of multi-mirror arrays (MMAs, also referred to as micromirror arrays or mirror matrices), which include a multitude of individually drivable micromirrors in order to deflect individual partial beams of the projection light of the illumination system in different directions, has recently been taken into consideration. For example, in this way the respective partial light-beams of the projection light can be directed to different locations in a pupil plane of the illumination system with the aid of the micromirrors. Since the intensity distribution in a pupil plane of the illumination system crucially influences the angular distribution of the projection light, the angular distribution can be set more flexibly by individually tilting the micromirrors. Particularly in connection with so-called unconventional illumination settings, in which an annular region or several poles in the pupil plane are illuminated, the use of MMAs can enable the angular distribution to be adapted to the respective circumstances—in particular, to the mask to be projected—without, for example, diffractive optical elements having to be exchanged.

Such MMAs are frequently produced as microelectro-mechanical systems (MEMS) by lithographic processes such as are known from semiconductor technology. The typical structure sizes with this technology amount in some cases to a few micrometers. Known representatives of such systems are, for example, MMAs having micromirrors that can be digitally tilted about an axis between two end positions. Such digital MMAs are used in digital projectors for the reproduction of images or films.

However, for the application in the illumination system of a microlithographic projection exposure apparatus it is desirable for the micromirrors to be capable of assuming—quasi-continuously and with a high precision—any tilt angle within an angular working range. The actuators that bring about the tilting of the micromirrors may in this case have been constructed, for example, as electrostatic or electromagnetic actuators. Thus in the case of known electrostatic actuators the tilting of the micromirror is based, for example, on the fact that a fixed control electrode and a mirror electrode fitted on the rear of a micromirror attract variably strongly, depending upon the applied voltage. Via a suitable suspension and several actuators the micromirror can consequently be tilted by arbitrary tilt angles.

By reason of high demands made of the precision in the course of tilting the micromirrors, it is desirable for the actuators to be driven extremely precisely by drive electronics. In this connection it is to be observed that by virtue of the plurality of individual mirrors, for example 1000, in an MMA—which are usually driven with the help of several actuators per mirror—it is desirable for such drive electronics to be designed efficiently.

In particular, for example for the purpose of driving an MMA with electrostatic actuators of drivers arranged in an extremely small space, it is desirable for a multitude of different output-voltage values to be generated with high voltage. According to aspects in the state of the art, the desired output voltage is generated in a conventional driver circuit, a so-called Class-A circuit, with the aid of transistors and resistors which are fed with a high voltage by way of supply voltage. Owing to the principle, however, in a Class-A circuit a static leakage current invariably flows to earth through the transistor and the resistor. As a result a considerable dissipation of power can arise in conjunction with evolution of heat. For reasons of power dissipation, it is therefore desirable for the resistors to be highly resistive, with the result that they may occupy a large space within the driver and hence within the drive electronics. In the case of the drive of larger MMAs with over 1000 mirrors, this has a particularly disadvantageous effect, since the drivers are desirably positioned as close as possible to the MMA in an extremely small space.

One possibility to encounter the problems that have been outlined above is described in U.S. Pat. No. 6,940,629 B1. The drive of an MMA mirror is undertaken therein via an integrating driver stage in which an output current is integrated on an external and/or internal capacitor. The output current in this case is proportional to a reference current which is generated from a digital value by digital-to-analogue conversion. In this connection the digital value is generated by a monitoring unit which is not specified in any detail in the patent. According to this publication the setting of the output voltage for an actuator of the micromirror is obtained by a reference current of adjustable duration being supplied to an integrator via a high-voltage element and by the desired voltage for adjusting the respective micromirror being established by the choice of the duration of the flow of current. In this case the duration of the flow of the reference current is established via digital control signals.

SUMMARY

The disclosure provides an illumination system for a microlithographic projection exposure apparatus that includes a mirror arranged in a multi-mirror array and capable of being tilted with the help of at least one actuator. The illumination system also includes drive electronics for the mirror. The disclosure also provides methods for monitoring and/or driving the mirror, which permit a drive that is as precise as possible.

The drive electronics include a coarse digital-to-analogue converter with a first resolution, and a fine digital-to-analogue converter with a second resolution, where the second resolution is higher than the first resolution. There is also an adder, which is configured to add output quantities that are output by the two digital-to-analogue converters to yield an overall quantity that can be applied at least indirectly to the at least one actuator of the mirror.

In the normal case the output quantities of the digital-to-analogue converters will be voltages, so that the coarse digital-to-analogue converter has a first output-voltage range and the fine digital-to-analogue converter has a second output-voltage range. However, for a person skilled in the art, currents will also, of course, be conceivable as output quantities of a digital-to-analogue converter.

In the case of the two-stage digital-to-analogue converter concept, the second output-voltage range may be smaller than the first output-voltage range. As a result, in the course of driving the mirror with the fine digital-to-analogue converter it is possible to undertake small changes of voltage and nevertheless to cover a large voltage range with the aid of the coarse digital-to-analogue converter.

It can be advantageous if an output voltage that is output by the coarse digital-to-analogue converter can be chosen in such a way that a desired total voltage to be applied to the at least one actuator is obtained, if a voltage that is output by the fine digital-to-analogue converter lies in the middle of the second output-voltage range. As a result, the fine digital-to-analogue is able to correct the total voltage applied at the actuator in a maximal range in the upward and downward directions. Since the coarse digital-to-analogue converter allows only larger steps for its output voltage, the output by the fine digital-analogue converter might only lie approximately in the middle of the output-voltage range.

This can be brought about particularly easily if the second output-voltage range is symmetrical about 0 V, since in this case the coarse digital-to-analogue converter only has to output an output voltage that is as close as possible to the desired total voltage.

For a precise drive of a mirror of the multi-mirror array it is generally sufficient if the second output-voltage range lies within a maximal voltage range from approximately −5 V to approximately +5 V.

In order to address the digital-to-analogue converters in the drive electronics, there may be provision that the two digital-to-analogue converters are capable of having a common digital input signal applied to them. Circuits connected upstream of the actual conversion electronics of the digital-to-analogue converters can in this case branch off the signals that are relevant for the respective digital-to-analogue converter—for example, a certain bit domain of a digital value—and supply them to the conversion electronics.

However, it can also be advantageous if the two digital-to-analogue converters are capable of having different digital input signals applied to them, since under certain circumstances this reduces the circuit complexity of the drive electronics.

Since in the case of a regulated system it is substantially only the relative resolution of the digital-to-analogue conversion that matters—and therefore a strictly linear converter characteristic of the coarse digital-to-analogue converter can be dispensed with, it is advantageous if the coarse digital-to-analogue converter has a non-linear converter characteristic, in order to keep the cost for the implementation of the coarse digital-to-analogue converter low.

In this case the coarse digital-to-analogue converter may have a converter characteristic that corresponds to an inverse function of a function that represents a relationship between a tilt angle of the mirror and the overall quantity applied at the at least one actuator. As a result, the quadratic dependence of the tilt angle of the mirror on the applied voltage, arising in the case where use is made of an electrostatic actuator, can, for example, be compensated with the aid of the converter characteristic and the remainder of the drive electronics does not have to take this dependence into account.

According to another advantageous configuration of the disclosure, the drive electronics include an open-loop control unit which is configured to drive the coarse digital-to-analogue converter at least indirectly. This enables a coarse approximation of the tilt angle of the mirror to a desired tilt angle by a control system without control loop.

In the case where use is made of an open-loop control unit, it is particularly advantageous if the illumination system includes a measuring system for measuring an actual tilting of the mirror, the measuring system including a detector which is configured to detect a pattern, and including a pattern-recognition system for searching for the detected pattern within an overall pattern. In this case the search of the pattern-recognition system can be restricted to a subregion of the overall pattern, by the pattern-recognition system receiving, for example, the same signal as the open-loop control unit or a signal emanating from the control unit. As a result, little computing power is needed for the purpose of searching for the pattern.

Advantageously there may also be provision that the drive electronics include a closed-loop control unit which is configured to drive the fine digital-to-analogue converter at least indirectly. With the aid of the closed-loop control unit, which operates with a closed control loop and which drives the fine digital-to-analogue converter, the tilt angle of the mirror can be set exactly. In particular, relatively small mechanical or electrical perturbations, which are expressed in a change of the tilt angles, can be corrected by this approach with a high resolution.

Furthermore, the drive electronics may include a coordinate-transformation unit which is configured to subject digital information intended for the coarse digital-to-analogue converter and/or for the fine digital-to-analogue converter to a transformation of coordinates. As a result, more complicated relationships between actuator drive and the actual tilting of the mirror can be registered. This is of interest, in particular, when the tilting of the mirror is dependent on the combined drive of several actuators, for example three actuators.

A method can be performed as follows. Firstly an illumination system for a microlithographic projection exposure apparatus is provided which contains the mirror. The mirror is arranged in a multi-mirror array and being capable of being tilted with the help of at least one actuator. Then a first item of digital information and a second item of digital information are provided. Next, the first item of digital information is converted into a first analogue quantity with a first resolution. After this, the second item of digital information is converted into a second analogue quantity with a second resolution, which is higher than the first resolution. Finally, the two analogue quantities are added to yield an overall quantity, and the latter is applied at least indirectly to the at least one actuator. By virtue of this method, it is made possible that the actuator of the mirror can be driven with a large range of values and with a high resolution without using particularly high-quality digital-to-analogue converters which are expensive to implement and which possess both a large range of values and a high resolution.

Advantageously in the above method the first item of digital information can be provided by a open-loop control, and the second item of digital information can be provided by a closed-loop control. By virtue of the fact that the open-loop control already places the analogue overall quantity roughly in the vicinity of a desired working-point, the closed-loop control may have been designed for a fine regulation with high resolution.

If the regulating range in this case is chosen to be sufficiently small, it is, in addition, advantageous if the closed-loop control is a linear regulation system, since a linear regulation system can be designed to be particularly simple and stable.

Advantageously the closed-loop control can operate differently in an adjusting phase and in a holding phase, so that, for example, differing bandwidths for the overshoot behaviour can be established by amendment of the regulating parameters.

The first item of digital information can be provided by, firstly, a nominal tilt angle being preset by which the mirror is to be tilted. After this, the first item of digital information is provided by a open-loop control as a function of the nominal tilt angle. Furthermore, in this variant of the method, after the at least indirect application of the overall quantity to the at least one actuator the following steps are executed iteratively: measuring an actual tilt angle of the mirror; determining a difference between the actual tilt angle and the nominal tilt angle; termination of the iteration if the difference is smaller than a preset threshold value; determining the second item of digital information as a function of the difference; converting the second item of digital information into the second analogue quantity; adding the two analogue quantities to yield an overall quantity; applying the overall quantity to the at least one actuator. Accordingly, in this method a coarse approximation of the actual tilt angle to the nominal tilt angle is obtained with the help of a open-loop control. After this, the actual tilt angle is approximated iteratively to the nominal tilt angle with a high resolution with the aid of the conversion of the second item of digital information until such time as the difference between actual and nominal tilt angles falls below a threshold value. The method therefore enables a setting of the actual tilt angle without an endlessly-running control loop being needed. During the implementation other sequences can be chosen for the individual steps. In particular, the comparison between the difference and the threshold value can be effected, depending upon the exemplary embodiment, at different times or additionally between further steps. In different phases of the method the threshold values can, in addition, be varied.

In an advantageous further development of the iterative method the maximal number of iterative repetitions is limited. By this approach it is ensured that in the event of a malfunction of the actuator, for example, the iteration loop of the method is exited.

Information about a tilting of the mirror can be provided by a pattern-recognition system which searches for a pattern in an overall pattern. The pattern-recognition system in this case is restricted to a subregion of the overall pattern as a function of the first item of digital information. By virtue of the fact that the search for the pattern is restricted to a smaller subregion, the computing effort of the pattern-recognition system is reduced, so that the system can be realised more easily.

The disclosure provides a method for monitoring the mirror positions of a plurality of mirrors in a multi-mirror array, wherein firstly a sampling-rate is determined such that measured values, which are measured by a measuring system, are present with a variance that lies within a given specification. However, sampling is then effected at an N-fold sampling-rate and with correspondingly increased variance, which is chosen in such a way that no aliasing any longer occurs. Finally, the measured values that are present at N-fold sampling-rate are filtered by averaging, so that filtered values obtained thereby are present with a variance within the given specification. The advantage of such a method consists in the fact that, by virtue of the increased sampling-rate of the measured values, no aliasing signals get into systems connected downstream which subject the measured values to further processing, and the measured values are nevertheless present with a variance within the specification. This is advantageous, in particular, in regulation systems, since aliasing signals therein may result in unwanted oscillations of the overall system. A realisation of this inventive idea is possible independently of the bipartite digital-to-analogue conversion described above, though for an advantageous configuration a combination with the driving apparatuses and methods that have been described is intended.

Advantageously in the above process the N-fold sampling-rate is determined in accordance with the Nyquist theorem. The Nyquist theorem states that the highest occurring frequency of an analogue signal has to be sampled at least twice the frequency for it to be ensured that no aliasing occurs.

The disclosure also provides an illumination system for a microlithographic projection exposure apparatus. The illumination system includes including a plurality of mirrors arranged in a multi-mirror array, a measuring and regulating system for measuring and regulating tilting motions of the mirrors. The measuring and regulating system is configured to measure the tilting motions at random time intervals. A measurement of the measured values at random time intervals prevents the occurrence of aliasing signals during digitisation. In this context, 'random' means that the time intervals between individual measured values desirably do not repeat periodically in relation to the occurring frequencies of the analogue signal. This inventive idea can also be realised independently of a two-stage digital-to-analogue conversion. However, a combination with the two-stage digital-to-analogue conversion results in some embodiments.

The disclosure further provides an illumination system for a microlithographic projection exposure apparatus. The illumination system includes a mirror which is arranged in a multi-mirror array and is capable of being tilted with the help of at least one actuator, and drive electronics for the mirror. For the purpose of generating voltages that are applied to the at least one actuator of the mirror, the drive electronics include an integrating driver stage including an input and a differentiating stage including an output, the output of the differentiating stage being connected at least indirectly to the input of the integrating driver stage. This makes it possible to drive an integrating driver stage, which involves less space and less power in comparison with conventional driver stages, via the differentiating stage with a signal that would be applied to a conventional driver stage. As a result, the other circuit parts of the drive electronics can be retained.

An implementation of the integrating driver stage in an application-specific integrated circuit optionally involves an area of less than 50% of the area of the driven mirror. As a result, at least two actuators per mirror can be driven without the burden of differing signal propagation times by reason of excessive space for the drivers.

By reason of its efficient mode of operation, all the methods or apparatuses described above are especially suitable for monitoring and driving the mirror position of at least 1000 mirrors, such as 4000 mirrors.

BRIEF DESCRIPTION OF THE DRAWINGS

Further features and advantages of the disclosure will become apparent from the following description of exemplary embodiments with reference to the drawings, in which.

DETAILED DESCRIPTION

The Illumination System

Figure 1:
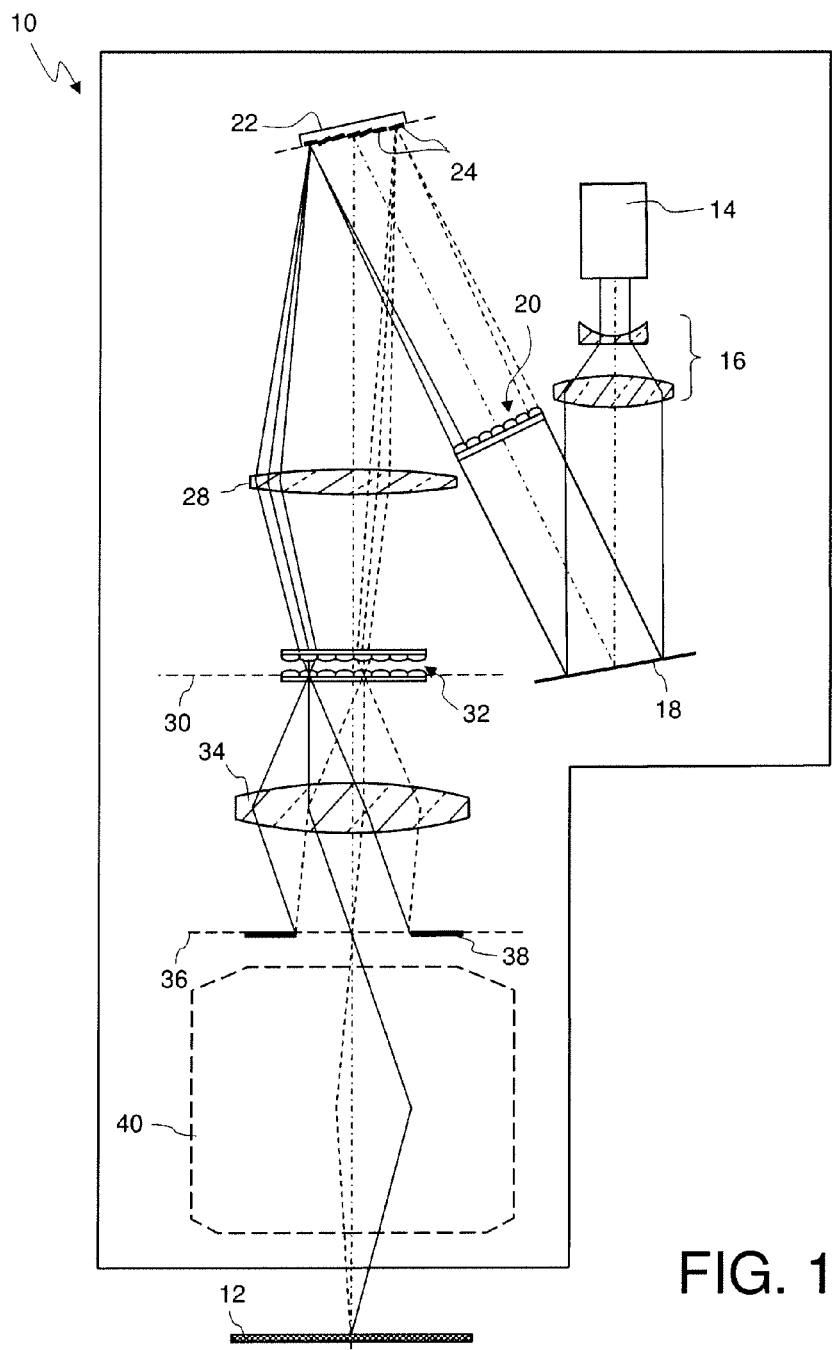
FIG. 1 is a simplified meridional section through the illumination system, according to the disclosure, for a microlithographic projection exposure apparatus with a multi-mirror array.

FIG. 1 shows, in a greatly simplified meridional section, an illumination system 10 for a microlithographic projection exposure apparatus. The illumination system 10 serves to illuminate a mask 12, which bears lithographic structures to be imaged, with projection light. A projection objective, which is not shown, then projects the illuminated structures, usually reduced in size, onto a wafer coated with a light-sensitive resist.

An important factor in this connection, which crucially influences the imaging properties of a microlithographic projection exposure apparatus, is the angular distribution of the projection light. This is understood to mean the distribution of the total intensity of the light that is incident on a mask point to the different angles of incidence at which the light impinges on the mask point. In particular, it is desirable to adapt the angular distribution of the projection light to the type of the structures to be illuminated, in order to obtain an imaging that is as optimal as possible.

For this purpose the illumination system 10 includes in its ray path a multitude of optical elements which in FIG. 1 have been reproduced only in simplified manner or not at all.

The projection light generated by a laser 14 or by another light-source is firstly expanded by a first optical element 16 and directed via a plane mirror 18 onto a microlens array 20. The plane mirror 18 serves mainly to keep the external dimensions of the illumination systems 10 compact.

Following the optical path further, the projection light impinges on a so-called multi-mirror array 22 which will be elucidated in more detail below with reference to FIG. 2. The multi-mirror array 22 includes a multitude of micromirrors 24 which may be capable of being tilted individually. In this connection the microlens array 20 situated upstream directs individual partial light-beams of the projection light onto the micromirrors 24.

The individual micromirrors 24 can be tilted in such a way that the partial light-beams of the projection light pass through a pupil plane 30 at freely selectable locations via a second optical element 28. A fly's-eye integrator 32 arranged close to this pupil plane 30 generates in the pupil plane 30 a plurality of secondary light-sources which via a third optical element 34 uniformly illuminate an intermediate field plane 36 in which adjustable diaphragm elements 38 are arranged. In this connection the third optical element 34 generates a correspondence between angles in the pupil plane 30 and locations in the intermediate field plane 36. The latter is projected by an objective 40 onto a mask plane in which the mask 12 is arranged. The intensity distribution in the pupil plane 30 consequently determines the illumination-angle distribution not only in the intermediate field plane 36 but also in the mask plane.

As a result of different tilting motions of the individual micromirrors 24 of the multi-mirror array 22, it is consequently possible for different angular distributions of the projection light to be set very flexibly. Given suitable drive of the micromirrors 24, the angular distribution can even be changed during an exposure.

The Multi-Mirror Array

Figure 2:
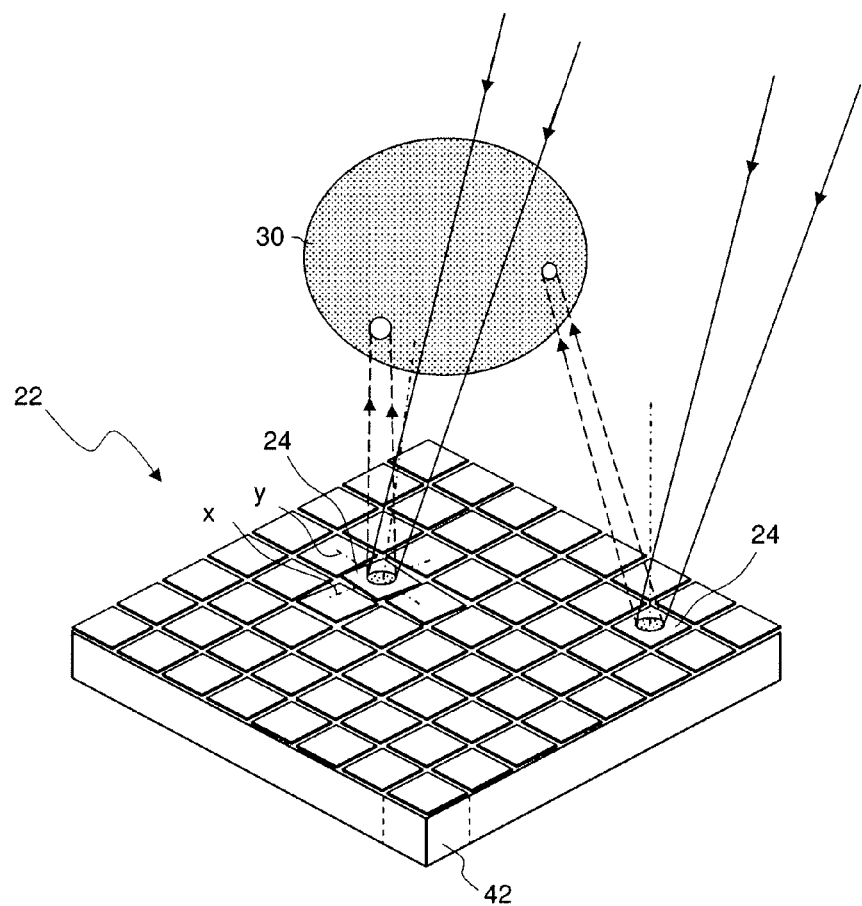
FIG. 2 is a simplified perspective representation of the multi-mirror array of the illumination system with several mirrors.

FIG. 2 show a simplified perspective representation of the multi-mirror array 22 in which the individual micromirrors 24 are plane and have a square contour.

In order to direct an incident partial light-beam, which is generated by a lens of the microlens array 20 preceding in the ray path, to arbitrary locations within the pupil plane 30, each micromirror 24 is mounted so as to be capable of being tilted about two tilt axes x and y. The actual tilting about the tilt axes x, y is controllable via actuators which are not shown, whereby to each micromirror 24 its own set of actuators should generally be assigned, in order that the micromirrors 24 are capable of being driven individually. A micromirror 24 and its associated actuators can therefore be combined to form a mirror unit 42.

The greater the number of mirror units 42 in a multi-mirror array 22, the more finely can the intensity distribution in the pupil plane 30 be resolved. Multi-mirror arrays 22 with several thousand micromirrors 24 that are capable of being tilted about two tilt axes x, y enter into consideration. Multi-mirror arrays 22 of such a type can, for example, be manufactured using MEMS technology, and employ various actuation methods.

The Structural Schema of the Drive

Figure 3:
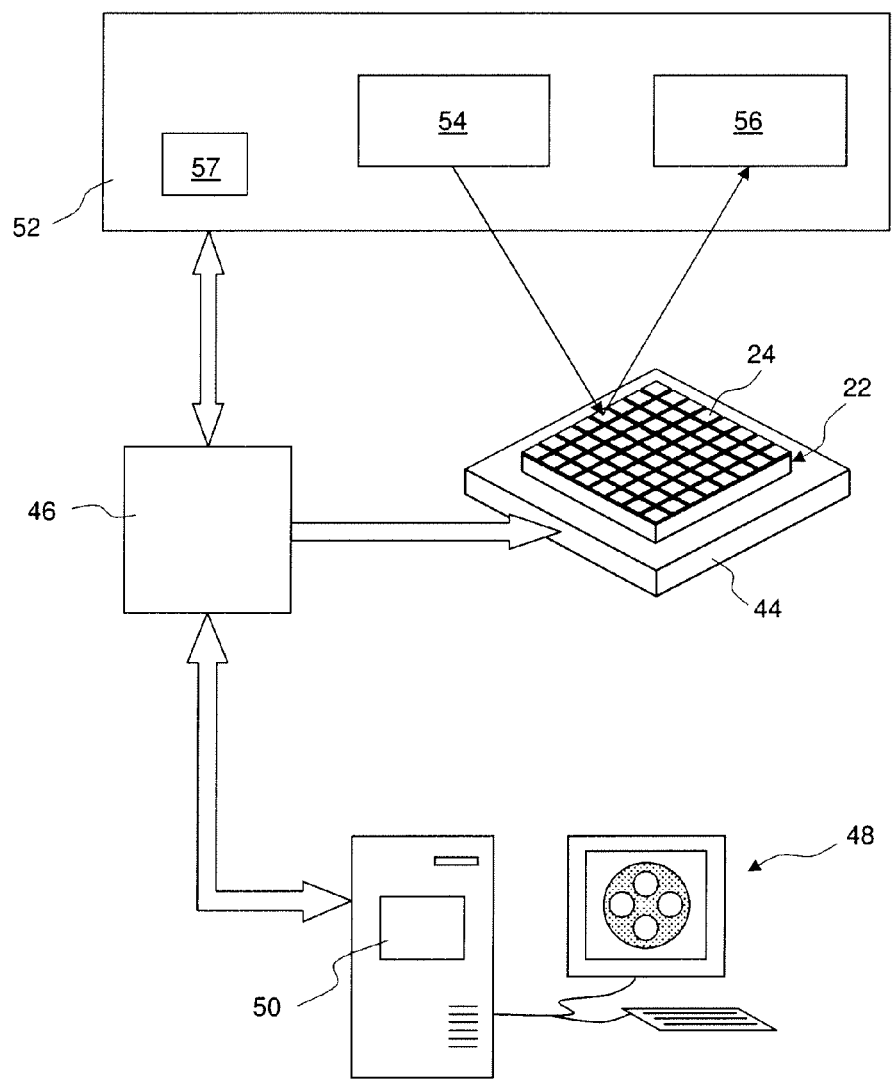
FIG. 3 is a highly schematic representation which shows how various components of the illumination system interact in order to drive the mirror positions of the individual mirrors of the multi-mirror array.

FIG. 3 shows, in a schematic representation, how various components of the illumination system 10 interact for the purpose of driving the multi-mirror array 22.

The multi-mirror array 22, which has been manufactured using MEMS technology, is connected to power electronics 44 which generate the analogue control signals needed for the purpose of driving the actuators of the individual mirror units 42. In order to keep perturbations in the electrical analogue signals small, the latter have to be generated as closely as possible to the actuators of the mirror units 42. By reason of the multitude of the mirror units 42, in the design of the power electronics 44 care has to be taken, in addition, to ensure that the space involved for the individual circuit parts is kept small.

Via a digital control and regulation device 46 the power electronics 44 have digital information applied to them which digitally encodes the individual values of the analogue signals to be output. Depending upon the driving and regulating algorithm that is being implemented, the digital control and regulation device 46 may be realised as an FPGA or as a microprocessor, such as, for example, a DSP microprocessor with appropriately programmed algorithms.

In order to establish a desired tilting of the individual micromirrors 24, the digital control and regulation device 46 exchanges data with an operator interface 48 of the illumination system 10. Usually a commercial PC performs the function of the operator interface 48. Besides other parameters of the illumination system 10, at such an operator interface 48 the operator can specify the desired illumination of the pupil plane 30.

Starting from this desired illumination of the pupil plane 30, a pupil algorithm 50 then selects via which micromirror 24 of the multi-mirror array 22 which point of the pupil plane 30 is illuminated. The pupil algorithm 50 may, as shown in FIG. 3, run as a program section in the PC of the operator interface 48, or may have been jointly integrated within the digital control and regulation unit 46.

With the help of the operator interface 48, information about the state of the multi-mirror array 22 can furthermore be interrogated. Thus the digital control and regulation device 46 can, for example, communicate information about non-functional mirror units 42 to the operator interface 48. This information can then, for example, be used by the pupil algorithm 50 in order to take into account the non-functional mirror units 42 when assigning the individual micromirrors 24 to the points of the pupil plane 30 to be illuminated. On the other hand, this information can be made accessible to the operator, in order possibly to interrupt the operation of the microlithographic projection exposure apparatus and to carry out maintenance work.

The Optical Measuring System

If a closed-loop control with a closed control loop comes into operation in the course of driving the multi-mirror array 22, the digital control and regulation device 46 in addition exchanges data with a measuring system 52 with which the mirror positions of the individual micromirrors 24 are monitored.

To this end, the measuring system 52 is provided with a separate light-source 54 which illuminates the micromirrors 24 with measuring light. To avoid that the measuring light of the separate light-source 54 passes through the pupil plane 30 and subsequently impinges on the mask 12, the separate light-source 54 is arranged in such a way that the angle of incidence of the measuring light differs from that of the projection light. After reflection on the individual micromirrors 24, the measuring light impinges on a detector 56.

Depending upon the measuring system 52 being used, the separate light-source 54 may, for example, include a VCSEL array (vertical-cavity surface-emitting laser) with which a laser beam can be directed onto each individual micromirror 24. The reflected laser beams then impinge, for example, onto the detector 56 which is constructed as a four-quadrant detector and is consequently position-sensitive. From the position of the laser beam on the position-sensitive detector 56, the real actual tilting of the respective micromirror 24 can then be determined by an evaluating system 57 which is contained either in the measuring system 52 or, in the form of an algorithm, in the digital control and regulation device 46.

Optical Measuring System via Pattern Recognition

In another type of measuring system 52 the separate light-source 54 generates an overall pattern with which the entire surface of the multi-mirror array 22 is illuminated. Appropriately arranged recording optics serving as detector 56—such as, for example, a camera—then register the patterns that are visible on the individual micromirrors 24. With the help of a pattern-recognition system—which in turn is realised in the measuring system 52 or in the digital control and regulation device 46—by way of evaluating system 57, the tilting of the individual micromirrors 24 is then determined by the position of the registered pattern within the overall pattern being determined.

Further particulars relating to the measuring system 52 which is shown can be inferred from WO 2008/095695 and are, to this extent, to be made the subject of the present application by reference.

The Mirror Unit

For the purpose of tilting the micromirror 24 of a mirror unit 42, in the present exemplary embodiment use is made of actuators that are based on an electrostatic attraction between two opposite electrodes at differing potential.

Figure 4:
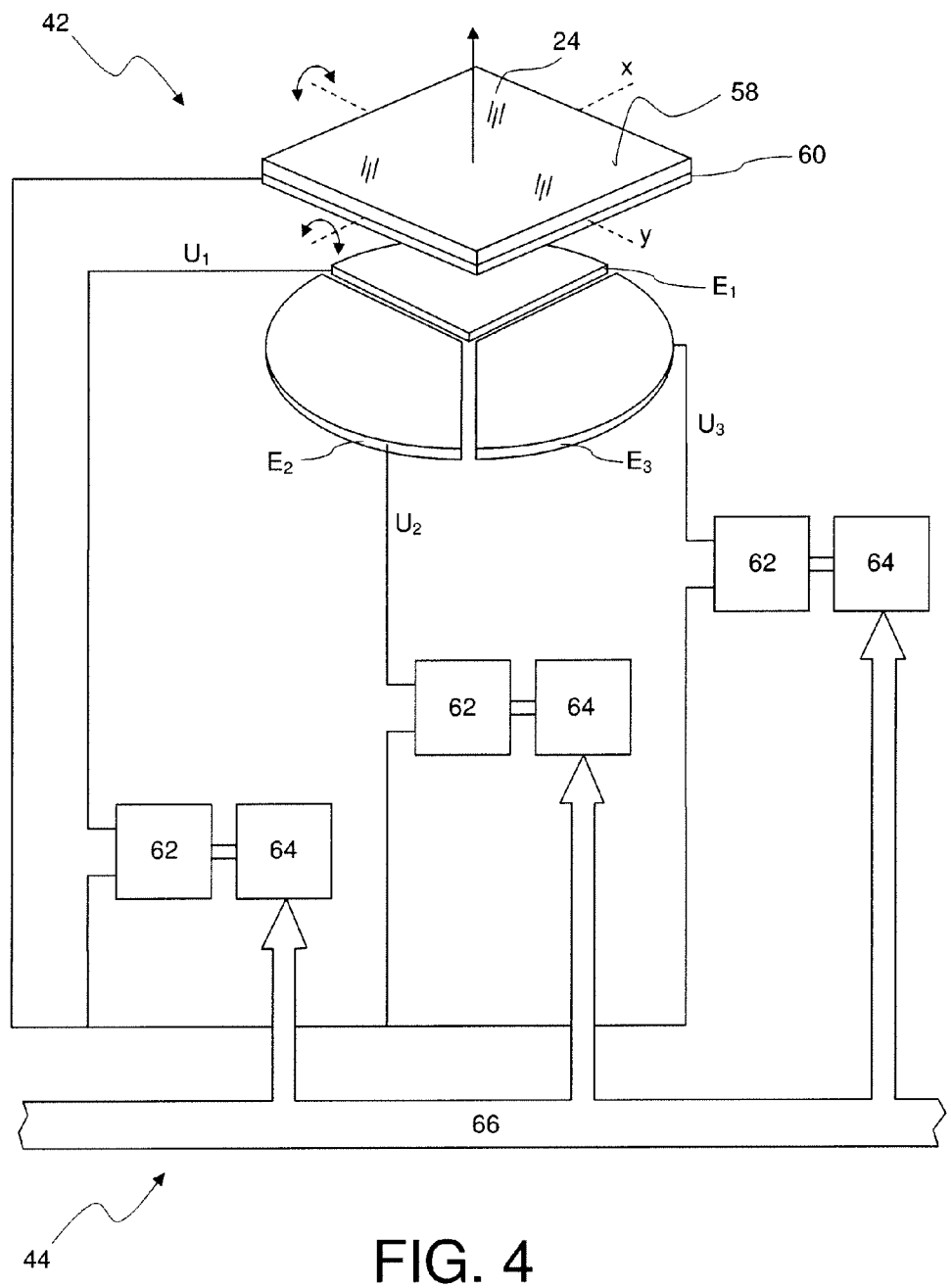
FIG. 4 is a simplified perspective representation of a mirror unit with a mirror and with associated electrostatic actuators, as well as a schematic circuit diagram of power electronics with digital-to-analogue converter units and drivers, via which the electrostatic actuators are driven.

FIG. 4 shows, in a greatly simplified perspective representation, certain components of such a mirror unit 42, realised using MEMS technology, with electrostatic actuators. The rectangular, plane micromirror 24 of the mirror unit 42 is mounted so as to be capable of being tilted about the two tilt axes x and y via solid joints, which are not shown, in a type of cardanic suspension. Both the micromirrors 24 and the solid joints are manufactured by lithographic structuring in Si wafers. On its upward-directed mirror surface 58 the micromirror 24 bears a reflective coating which guarantees an almost complete reflection of the projection light.

On the downward-directed rear of the micromirror 24 a conductive mirror electrode 60 is arranged, for example as a result of vapour deposition of metal. Via a ceramic spacer, three control electrodes $E_1$, $E_2$ and $E_3$ in the form of circular-disc segments are arranged at a certain spacing from the mirror electrode 60, remote from the latter.

For the purpose of tilting the micromirror 24, various voltages are now applied between the mirror electrode 60 and the three control electrodes $E_1$, $E_2$ and $E_3$, so that electrostatic forces act between the mirror electrode 60 and the individual control electrodes $E_1$, $E_2$ and $E_3$, from which, in conjunction with the restoring torques of the solid joints, a certain tilting of the micromirror 24 results. In this connection, the greater the voltage applied between the mirror electrode 60, on the one hand, and the control electrodes $E_1$, $E_2$ and $E_3$, on the other hand, the more strongly these attract one another and the more strongly the mirror surface 58 is inclined in the direction of the respective control electrode $E_1$, $E_2$ or $E_3$.

The tilting of the micromirror 24 can accordingly be adjusted via the magnitudes of the applied voltages. In the exemplary embodiment that is represented, the voltages needed for this purpose lie within the range between 0 V and 200 V, such as between 0 V and 100 V, and should be precisely adjustable in 0.05 V steps, optionally in still smaller steps, in order that the tilt angles of the micromirrors 24 are adjustable with sufficient precision.

Since the electrostatic forces are independent of the sign of the applied voltage, in other exemplary embodiments use may also be made of negative voltages. In addition, independently of the controllable voltage a bias voltage may have already been applied to the electrodes, which shifts the requisite ranges of the controllable voltages correspondingly.

In the lower region of FIG. 4 some circuit components of the power electronics 44 that are needed for this purpose are shown.

The high voltages that are applied between the three control electrodes $E_1$, $E_2$ and $E_3$ and the mirror electrode 60 are generated by three identically constructed drivers, here the drivers 62, the outputs of which are connected to the mirror electrode 60 and to, in each instance, one of the control electrodes $E_1$, $E_2$ and $E_3$.

By way of input signal to be amplified, each driver 62 receives, in turn, the analogue output signal of a digital-to-analogue converter unit 64 which will be elucidated below in still more detail with reference to FIGS. 5 and 6.

The three digital-to-analogue converter units 64 are linked to a common digital data bus 66 and receive from the latter the analogue voltages to be output, in the form of digital information. The data bus 66 may extend within the power electronics 44 for the purpose of driving several mirror units 42.

Since the electrical circuits of the drivers 62 and of the digital-to-analogue converter units 64 for all the mirror units 42 are repeated substantially identically in the power electronics 44, with the exception of peripheral addressing circuits, these can be implemented in compact manner in application-specific integrated circuits (ASICs). In particular, each driver 62 with the associated digital-to-analogue converter unit 64 may have been constructed in compact manner as a unit.

Figure 5:
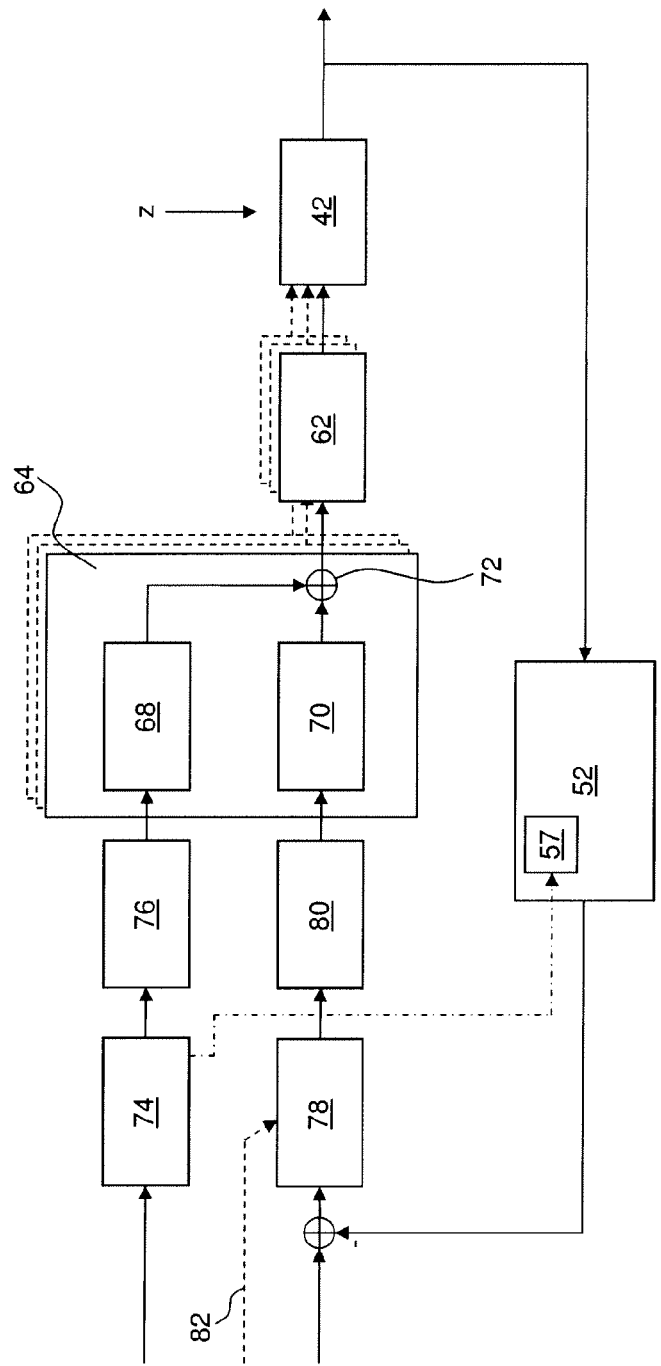
FIG. 5 show a control and regulation schema of a drive, according to the disclosure, of an individual mirror unit via a bipartite digital-to-analogue converter unit with a coarse digital-to-analogue converter and a fine digital-to-analogue converter.

The Control and Regulation with a Bipartite Digital-to-Analogue Conversion Concept FIG. 5 shows a control and regulation schema which outlines the open-loop control and the closed-loop control of the tilting of an individual micromirror 24 of the multi-mirror array 22.

As already mentioned, extensive parts of the circuit in the digital control and regulation device 46 are realised as digital circuits or as programs, in order to obtain a flexibility that is as high as possible in the course of driving the micromirrors 24. As a result, it is readily possible, to integrate further algorithms or to dispense with certain open-loop control components or closed-loop control components. The control and regulation schema that is shown therefore shows only an exemplary variant, which can be adapted by omitting or adding components.

As evident from the control and regulation schema of FIG. 5, the digital-to-analogue converter units 64, contained in the drive electronics 44, for converting the digital information into analogue signals exhibit a coarse digital-to-analogue converter 68, a fine digital-to-analogue converter 70 and also a voltage adder 72.

Since in the exemplary embodiment of the mirror unit 42 shown in FIG. 4 use is made of three control electrodes $E_1$, $E_2$ and $E_3$, in the control and regulation schema of FIG. 5 likewise three digital-to-analogue converter units 64 and three drivers 62 are represented, specifically by dashed functional blocks which are partially concealed. For the sake of simplicity, however, the following remarks are restricted to the representation of the drive of one of the control electrodes $E_1$, $E_2$ or $E_3$.

The two digital-to-analogue converters 68, 70 differ in that the fine digital-to-analogue converter 70 has a higher resolution than the coarse digital-to-analogue converter 68, the term 'resolution' here not designating—as is otherwise conventional in the case of digital-to-analogue converters—the number of subdivision steps of the output-value range, but relating directly to the smallest possible step between two output values. The smallest possible step of the analogue signal of the fine digital-to-analogue converter 70 that is output is consequently smaller than that of the coarse digital-to-analogue converter 68. The higher resolution is frequently associated with a smaller maximal voltage range, such as, for example, from approximately −5 V to approximately +5 V. In addition, when implementing the fine digital-to-analogue converter 70 care is taken to ensure that the latter has a converter characteristic that is as linear as possible.

The coarse digital-to-analogue converter 68, on the other hand, is distinguished by a lower resolution and a large maximal voltage range. As will become clear from the following explanatory remarks, in the case of the coarse digital-to-analogue converter 68 in addition the demands made of the linearity of the converter characteristic are not so strict as in the case of the fine digital-to-analogue converter 70. In the limiting case the converter characteristic should merely follow a strictly monotonic function.

The outputs of the two digital-to-analogue converters 68, 70 are connected to inputs of the voltage adder 72 which in turn outputs the added total voltage at the output of the digital-to-analogue converter unit 64. From there, the added total voltage is passed to the following driver 62.

In the following, an exemplary combination of coarse digital-to-analogue converter 68 and fine digital-to-analogue converter 70 will be elucidated.

As already mentioned, voltages between 0 V and 200 V are typically needed for a micromirror 24. Hence after the signal amplification by the driver 62 in the case of a 10 bit coarse digital-to-analogue converter 68, which is able to represent $2^{10}$=1024 different output values, smallest possible voltage steps of about 0.2 V arise. For a precise drive of the micromirrors 24, this resolution of the analogue signals is too low.

Therefore with the aid of the voltage adder 72 second voltage values of a 6 bit fine digital-to-analogue converter 70 are additively superimposed on the voltage values that are output by this coarse digital-to-analogue converter 68. The range of values of the fine digital-to-analogue converter 70 after the signal amplification by the following driver 62 lies between 0 V and 1.3 V. Hence with $2^6$=64 different output values the fine digital-to-analogue converter 70 has a resolution (voltage steps) of about 0.02 V.

By addition of the two output values of the two digital-to-analogue converters 68, 70 with the aid of the voltage adder 72 to yield an added total voltage, a relative resolution of 0.02 V is obtained after the signal amplification with this two-stage digital-to-analogue converter concept.

'Relative resolution' means in this connection that the overall digital-to-analogue converter unit 64 has a resolution of 0.02 V voltage steps only within the small output-voltage range preset by the fine digital-to-analogue converter 70. That is to say, although the total voltage can be varied by 0.02 V, it is not established exactly by the non-linearities of the coarse digital-to-analogue converter 68 relative to the absolute total-voltage range, since the voltage steps of the coarse digital-to-analogue converter 68 do not always correspond to exactly 0.2 V.

In contrast, an ideal digital-to-analogue converter would have, over the total-voltage range, a fixed resolving grid which would enable the precise output of, for example, 63.22 V. But digital-to-analogue converters—which work, for example, via a 'switched-capacitor' technique, particularly in the course of changing the most significant bit (MSB)—typically exhibit variably large voltage steps. Thus it may be that, in the case of the 10 bit coarse digital-to-analogue converter 68, at the transition from 01.1111.1110 to 01.1111.1111 as a rule a voltage step occurs which is different from that when changing from 01.1111.1111 to 10.0000.0000, since in the latter case many capacitors have to be recharged.

If, however, the digital-to-analogue converter unit 64 is used, as here, together with a regulation system for the purpose of adjusting the micromirrors 24, it is not the absolute resolution of the digital-to-analogue converter unit 64 that matters, since the regulation continuously corrects the total voltage that is output.

In the case of the above choice of the ranges of values of the digital-to-analogue converters, the 6 bit fine digital-to-analogue converter 70 with its 64 different output values superimposes approximately six resolution stages of the 10 bit coarse digital-to-analogue converter 68. A corresponding regulation therefore has the result, with the aid of the 6 bit fine digital-to-analogue converter 70, that the non-linearities, as well as a temporal drifting of the voltage of the coarse digital-to-analogue converter 68, do not appear in interfering manner.

As the control and regulation schema of FIG. 5 further shows, in the case where use is made of the two-stage digital-to-analogue converter concept that has been described a closed-loop control can be combined in particularly advantageous manner with a open-loop control. Adapted to the two-stage digital-to-analogue converter concept, to this end use is made of a bipartite system wherein the coarse digital-to-analogue converter 68 is controlled without a control loop and the fine digital-to-analogue converter 70 is regulated with a control loop.

The upper branch of the control and regulation schema shown in FIG. 5 illustrates the part that relates to the open-loop control.

The main constituent of the open-loop control is a control unit 74, which may be part of the digital control and regulation device 46 and may contain an inverse system-dynamics model. Stated in simplified manner, the control unit 74 anticipates, via an inverse model of the controlled system, the reactions of the micromirror 24 to changes of the actuating quantities and then outputs appropriately optimised sequences of actuating quantities as digital information in coded form. The actuating quantities are understood here to be the voltages applied to the control electrodes.

The digital information that is output by this control unit 74 is passed to the coarse digital-to-analogue converters 68 of the various digital-to-analogue converter units 64 via a coordinate-transformation unit 76.

The task of the coordinate-transformation unit 76 is to keep the manner of the actuation of the micromirrors 24—for example, whether the latter are driven via two, three or four actuators and to what extent the tilt angles of the micromirrors 24 depend on the actuating quantities—substantially transparent in relation to the control unit 74 connected upstream.

But the function of the coordinate-transformation unit 76 can also be performed partially or—given appropriately simple relationships—totally by the coarse digital-to-analogue converter 68. Thus in the case of electrostatic actuators, in which there is a substantially quadratic dependence of the tilt angles of the micromirror 24 on the voltages applied to the actuators, this dependence may have already been integrated into the converter characteristic of the coarse digital-to-analogue converter 68, so that the coordinate-transformation unit 76 can be dispensed with.

As represented in FIG. 5 by the dash-dotted line, the control unit 74 is, in addition, connected to the evaluating system 57 of the measuring system 52. As a result, the evaluating system 57 can receive information from the control unit, in order in this way—for example, in the case where use is made of a pattern-recognition system—to restrict the search for the search pattern in the overall pattern to a smaller region.

The closed-loop control via a control loop that is illustrated by the lower branch of the control and regulation schema includes a regulator 78, optionally a coordinate-transformation unit 80, the fine digital-to-analogue converter 70 and also the measuring system 52 which determines the actual tilt angles of the micromirrors 24.

The regulator 78 receives at its input the so-called control deviation which results as a difference between desired nominal tilt angles and the negatively regenerative actual tilt angles.

Furthermore, the regulator 78 receives, via a parameter line 82, information relating to the change of regulating parameters of the regulator 78. In particular, the parameter line 82 can be driven as a function of the nominal tilt angles, or the changes thereof, supplied to the open-loop control and to the closed-loop control. Hence the closed-loop control can be adapted, for example, to different desired aspects during an adjusting phase or a holding phase.

The output signal of the regulator 78 is applied via a coordinate-transformation unit 80 to the fine digital-to-analogue converter 70 of the digital-to-analogue converter unit 64. The fine digital-to-analogue converters 70 each generate output voltages which are added in the voltage adder 72 to the output voltages of the coarse digital-to-analogue converters 68 coming from the open-loop control. The resulting added total voltages are then applied to the actuators of the micromirror 24.

Since in the normal case the closed-loop control only has to balance out small perturbations z acting on the mirror unit 42, and hence can be reduced to a small range of values of the total voltage, it is possible to execute the closed-loop control as a linear regulation. For the same reason, under certain circumstances the coordinate-transformation unit 80 and an adapted converter characteristic in the fine digital-to-analogue converter 70 can be dispensed with.

By virtue of the superposition, described above, of the output-value ranges of the coarse digital-to-analogue converter 68 and of the fine digital-to-analogue converter 70, a certain total voltage can be generated by different combinations of output voltages of the two digital-to-analogue converters 68, 70. In order nevertheless to enable in the open-loop control part an unambiguous correspondence between the demanded output voltage and the digital input information of the coarse digital-to-analogue converter 68, the voltage of the coarse digital-to-analogue converter 68 is chosen by the control unit 74 and by the subsequent coordinate-transformation unit 76 in such a way that it comes as close as possible to the demanded output voltage minus one half of the range of values of the fine digital-to-analogue converter 70. After this, the output voltage of the fine digital-to-analogue converter 70 is chosen with the aid of the closed control loop in such a way that the added total voltage at the output of the voltage adder 72 comes as close as possible to the demanded output voltage which is applied at one of the control electrodes $E_1$, $E_2$ and $E_3$ of the micromirror 24. As a result, with the aid of the fine digital-to-analogue converter 70 a regulation range that is symmetrical about the demanded output voltage is available to the closed-loop control.

After a change of the nominal tilt angle, the control unit 74—where appropriate, on the basis of the integrated system-dynamics model—adjusts the output voltage of the coarse digital-to-analogue converter 68. After this, the voltage of the coarse digital-to-analogue converter 68 is only changed again if a renewed change of the nominal tilt angle is pending. Otherwise closed-loop control is effected exclusively via the fine digital-to-analogue converter 68 and the associated control loop.

Iterative Control Loop with Termination Criterion

If the perturbations z acting on the controlled system, i.e. both on the mirror unit 42 and on the power electronics 44, are sufficiently small, an iterative method with a termination criterion presents itself for the operation of the control loop.

In this case, as above, firstly the output voltage of the coarse digital-to-analogue converter 68 is established via the control unit 74. However, the control loop is then not operated as an endless control loop, but in a first step via the fine digital-to-analogue converter 70 the total voltage applied at the control electrode $E_1$, $E_2$ or $E_3$ of the micromirror 24 is adapted with the aid of the regulator 78. After this, with the aid of the measuring system 52 the actual tilt angle is determined and compared with the nominal tilt angle. If the control deviation established in this process falls below a preset value, the control loop is terminated and the two output voltages of the two digital-to-analogue converters 68, 70 are held. If the control deviation is greater than the preset value, a further step of adaptation of the output voltage of the fine digital-to-analogue converter 70 is performed. This is repeated until such time as the control deviation falls below the preset value or until a preset maximal number of repetitions has been reached.

By virtue of the termination criteria, less computing capacity is needed in the digital control and regulation device 46 than in the case of an endlessly repeating control loop. The computing capacity that is freed up can be used for further control electrodes $E_1$, $E_2$ or $E_3$ and micromirrors 24, so that the total cost of the digital control and regulation device 46 can be reduced.

Aliasing-Free Measured-Value Registration by the Measuring System

The realisation of the closed-loop control involves a simultaneously rapid, robust and precise measurement of the actual tilt angles of the micromirrors 24.

In many sampling measuring systems a relationship exists between the sampling-rate and the uncertainties of measurement arising, for which the variance serves here as a measure, so that at higher sampling-rate a measurement is possible only with increased variance. Conversely, a longer measuring-time per mirror results in a lower variance, i.e. lower uncertainties of measurement, of the measured values.

Therefore in measuring systems an upper limit for the variance of the measured values is often established, starting from the demanded precisions of the measured values, which then determines the maximal sampling-rate of the measuring system.

On the other hand, the Nyquist theorem states that, for the purpose of registering a signal with a certain frequency, sampling has to take place at least at a sampling-rate that is twice as fast, since otherwise so-called aliasing effects arise and the signal is registered as a beat with a lower false frequency. Since the mirror systems as mechanical systems with a PT2 response are in most cases band-limited, i.e. there is a maximal frequency of the perturbations or oscillations of the mirror that arise, in accordance with the Nyquist theorem the minimal sampling-rate is determined by the bandwidth of the mirror systems.

Consequently the properties for an aliasing-free sampling (i.e. high sampling frequency) and a low variance (low uncertainty of measurement) are in conflict with one another.

Figure 6:
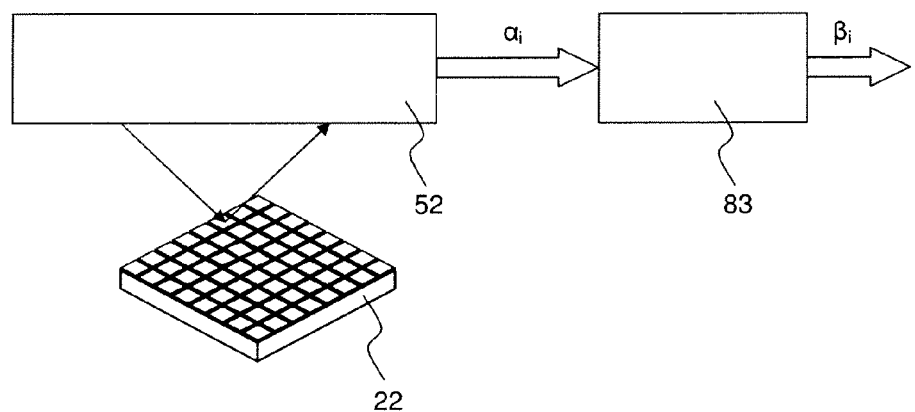
FIG. 6 is a schematic representation of the monitoring of the mirror positions with a signal-processing stage connected downstream.

As evident from FIG. 6, for the purpose of circumventing the problem that has been described a signal-processing stage 83—which, for example, can be realised in the form of an algorithm also as part of the digital control and regulation device 46—is connected downstream of the measuring system 52.

At its input the signal-processing stage 83 receives original sampled values $\alpha_i$, from the measuring system 52 and outputs at its output filtered sampled values $\beta_i$ which are then used in the closed-loop control of the digital control and regulation device 46 for the purpose of feedback.

The signal-processing stage 83 may include various filter methods for computing the filtered sampled values $\beta_i$ from the sampled values $\alpha_i$ which are subject to uncertainty. Thus, for example a so-called FIR filter (finite-impulse-response filter) can be employed. An FIR filter is a discrete, usually digitally implemented filter which is provided with an impulse response of finite length. But other filters, such as, for example, binomial, Gaussian or IIR filters and other low-pass filters can also be used in the signal-processing stage 83.

In the case of the application of a FIR filter, a filtered sampled value $\beta_i$ is a linear combination of past sampled values $\alpha_i$ and the current sampled value $\alpha_i$.

$$\beta_i = \sum_{k=0}^{N-1} c_k \alpha_{i-k} = [c_0 \ldots c_{N-1}][\alpha_{i-k} \ldots \alpha_{i-N+1}]^T \tag{1}$$

If it is now assumed that the sampled values $\alpha_i$ have the variance $\sigma^2_\alpha$ and the uncertainties of the $\alpha_i$ are uncorrelated, then for the variance $\sigma^2_\beta$ of the filtered sampled values $\beta_i$ there follows:

$$\sigma_\beta^2 = [c_0 \ldots c_{N-1}][c_0 \ldots c_{N-1}]^T \sigma_\alpha^2 = \left(\sum_{k=0}^{N-1} c_k^2\right)\sigma_\alpha^2 \quad (2)$$

In order to obtain sampled values $\beta_i$ with diminished variance, a rectangular band-pass filter presents itself, i.e. all the filter coefficients $c_k$ are equal to 1/N. As a result, for the variance of the filtered sampled values there follows:

$$\sigma_\beta^2 = \left(\sum_{k=0}^{N-1} \frac{1}{N^2}\right)\sigma_\alpha^2 = N\frac{1}{N^2}\sigma_\alpha^2 = \frac{\sigma_\alpha^2}{N} \quad (3)$$

That is to say, the filtered sampled values $\beta_i$ have an Nth of the variance of the original sampled values $\alpha_i$. In the case where use is made of a rectangular band-pass filter, a filtered sampled value $\beta_i$ is equal to the arithmetic mean value over the past N original sampled values $\alpha_i$.

Instead of now operating the measuring system 52 directly at a sampling-rate f, at which a demanded variance $\sigma^2_\alpha$ of the original sampled values $\alpha_i$ is not exceeded, it is useful to increase the sampling-rate by a factor N and to accept for the original sampled values $\alpha_i$ an increased (often N-fold) variance $\sigma^2_\alpha$ outside the specification. In this case it is assumed that a change in the sampling-rate merely changes the variance of the measuring system 52. The expected value of the measured values is to be assumed to be independent of the sampling-rate.

By virtue of the digital filtering in the signal-processing stage 83, the variance of the filtered sampled values $\beta_i$ is then reduced, as shown, by approximately a factor of 1/N, i.e. the variance originally demanded again obtains. The N-fold sampling-rate can be chosen in such a way that no aliasing any longer occurs (cf. Nyquist theorem).

The filtered sampled values $\beta_i$ are now present at N-fold sampling-rate N*f and, by virtue of the low-pass filtering, with reduced bandwidth. By virtue of a so-called down-sampling, the sampling-rate can, where appropriate, be reduced again without increasing the variance of the measured values. As a result, sampled values with the variance originally demanded are present at the sampling-rate f without or with clearly reduced aliasing.

In principle, an anti-aliasing filtering is accordingly realised as a digital filter, and simultaneously a so-called over-sampling for 'cancelling' the increased variance is utilised, as a result of which use may be made of filters with lower edge steepness.

Another possibility for avoiding aliasing effects in the course of registration of the actual tilt angles by the measuring system 52 is based on registering the measured values at random time intervals, in particular at non-periodic time intervals. By virtue of the fact that a strictly periodic registering of the measured values is avoided, excessively high frequencies do not manifest themselves in an aliasing beat of lower frequency, which would be detrimental, particularly for the stability of a subsequent closed-loop control.

The Data Bus

Figure 7:
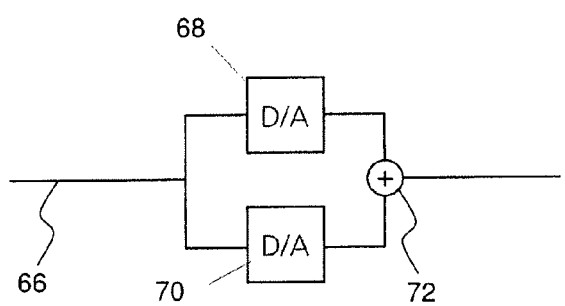
FIG. 7 is a schematic representation of a further exemplary embodiment in which the coarse digital-to-analogue converter and the fine digital-to-analogue converter of the power electronics are supplied with a common item of digital information.

One possible way in which the wiring complexity of the power electronics 44 can be reduced is shown in FIG. 7. In this exemplary embodiment the digital information is also transmitted within the digital-to-analogue converter units 64 on the common data bus 66 to the coarse and fine digital-to-analogue converters 68, 70. In this process, circuits integrated within the two digital-to-analogue converters 68, 70 select from the data bus 66 the information intended for the corresponding converter. As a result, the wiring complexity is only slightly increased, despite the two-stage converter concept.

The Electronic Drivers

Figure 8:
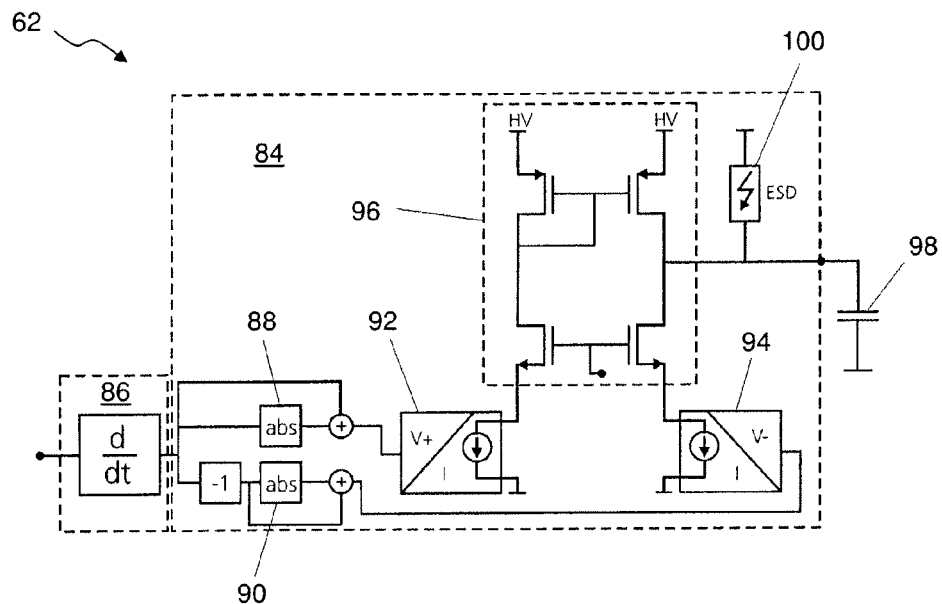
FIG. 8 is a schematic representation of a driver that is used in the power electronics.

FIG. 8 shows a schematic representation of the driver 62 which is used in the power electronics 44, it being a question of an integrating driver stage 84 with a differentiating stage 86 connected upstream.

The input signal applied at the driver 62 is firstly passed to the differentiating stage 86. Then the differentiated signal applied at the output of the differentiating stage 86 is supplied to the integrating driver stage 84.

In the latter, via two absolute-value elements 88 and 90 in conjunction with two voltage-to-current converters 92 and 94 and also with a current-mirror circuit 96 on a capacitor 98, which is intended to represent the capacitance between a control electrode $E_1$, $E_2$ or $E_3$ and the mirror electrode 60, an integration of the signals originating from the differentiating stage 86 is performed.

For the purpose of protecting the microelectronic components against electrostatic discharges, an ESD component 100 is provided between the current-mirror circuit and the output of the integrating driver stage 84.

Figure 9:
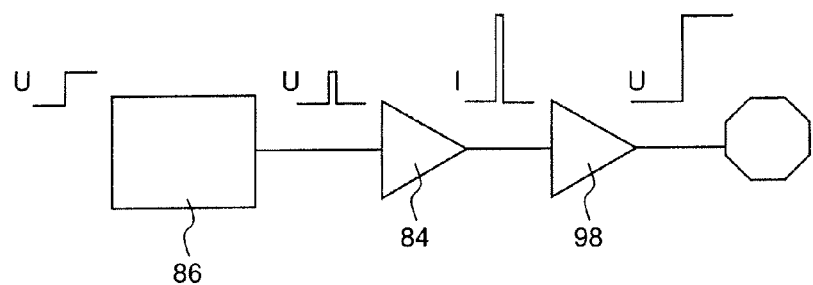
FIG. 9 is a block diagram of the mode of operation of the driver.

FIG. 9 shows the driver 62 according to the disclosure in the manner of a block diagram, wherein exemplary signal shapes of the signal applied at the input of the respective component have been represented.

At the input of the differentiating stage 86 a voltage jump is applied which, after the differentiation, is transmitted as a delta-like function to the integrating driver stage 84. After a voltage-to-current conversion of the integrating driver stage 84, acting as power amplification, the signal is supplied to the capacitor 98 acting as integrator. Hence between the mirror electrode and the corresponding control electrode $E_1$, $E_2$ or $E_3$ an amplified stepped voltage signal is obtained.

In the exemplary embodiment shown above, an analogue signal is already passed to the differentiating stage 86. The differentiation may, however, also be effected before the digital-to-analogue conversion, so that the differentiating stage 86 can also be arranged upstream of the digital-to-analogue converters 68, 70. In particular, the differentiating stage 86 may have been integrated as an algorithm into the digital control and regulation device 46.

The Implementation of the Electronic Drivers

In the following it will be elucidated with reference to FIG. 10 why in the exemplary embodiment that is shown the more complicated path via a differentiating stage 86 and an integrating driver stage 84 is chosen instead of a traditional 'Class-A' driver circuit.

Figure 10:
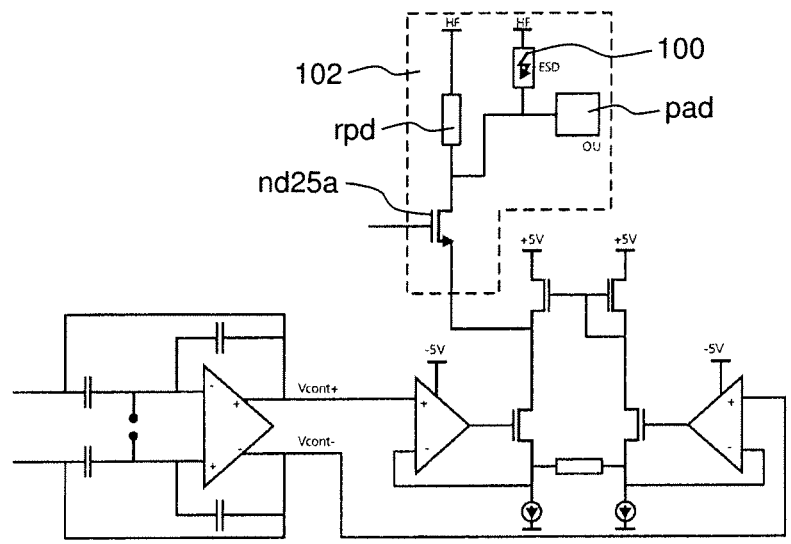
FIG. 10 is a circuit diagram and a possible implementation layout of a driver according to the state of the art.
Figure 10:
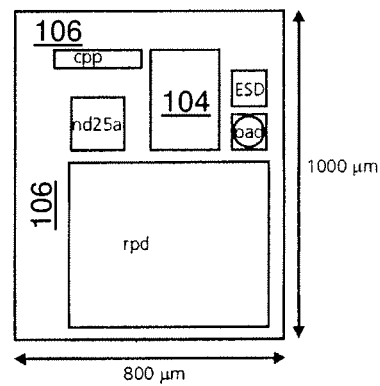

To this end, FIG. 10 shows a circuit diagram of certain parts of a driver 62 according to the state of the art and a possible implementation layout in an ASIC.

In the case of the implementation of the driver 62 in an ASIC, the space involved for the high-voltage region 102 surrounded by dashes in the upper circuit diagram is of particular significance, since the region, by reason of the high currents and voltages arising there, has a large share of the overall space involved for the circuit.

In the conventional driver circuit (Class-A' circuit) that is shown, the amplified high output voltage is generated with the aid of a transistor denoted by reference code nd25a and with the aid of a resistor rpd. In order to operate the transistor nd25a within its linear amplification range, in this case—owing to the principle—a static leakage current flows to earth from a high voltage HV (supply voltage) supplied from outside through the transistor nd25a and the resistor rpd, which in the resistor rpd results in a large dissipation of power in the form of heat. The resistor rpd in this case is desirably highly resistive at approximately 5 MΩ and therefore takes up a lot of space in the driver circuit, as evident from the implementation layout.

Together with the areas needed for a low-voltage range 104, a terminal contact pad, the ESD component 100 for protection against electrostatic discharges, a poly-poly capacitor cpp and also wiring regions 106 provided at the edge of the implementation area, an overall dimension of 800 μm by 1000 μm is obtained for the ASIC implementation.

When designing the multi-mirror arrays 24, care has to be taken to ensure that the space involved for the drivers 62 is smaller than the area of a micromirror 24 (in particular, half as large), since otherwise, given the multitude of micromirrors 24, problems arise in the design of the terminals. For if the space for the drivers 62 exceeds that of the micromirrors 24, the drivers are situated at varying distances from the micromirrors 24 assigned to them, and terminal leads additionally have to be provided, further increasing the space for the circuits and resulting, in particular, in varying signal propagation times.

Figure 11:
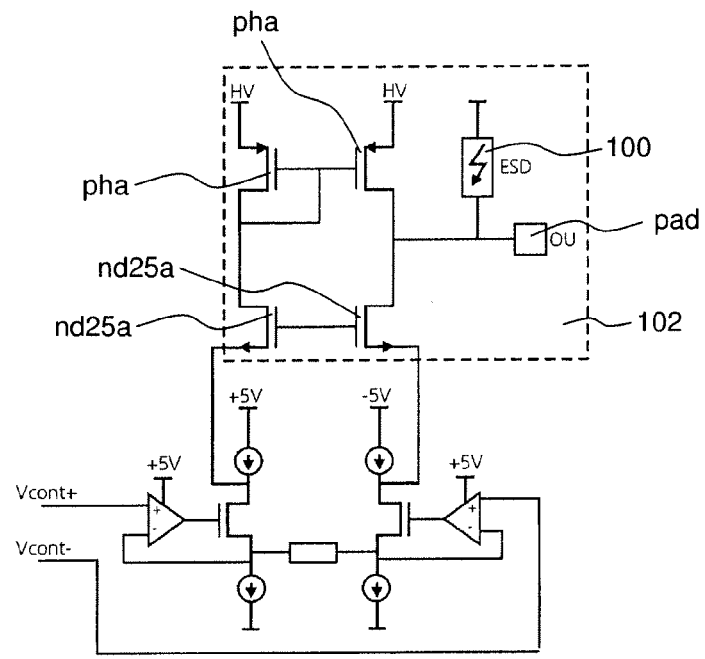
FIG. 11 is a circuit diagram and a possible implementation layout of the driver according to the disclosure, which uses a differentiating stage and an integrating driver stage.
Figure 11:
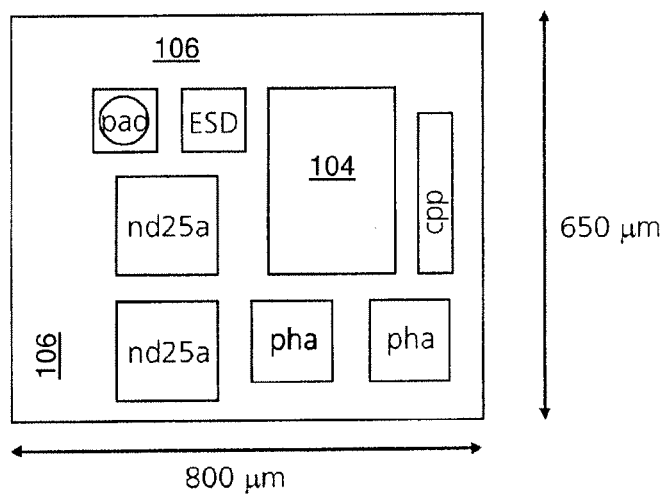

In order to diminish the space for the drivers 62, FIG. 11 therefore shows a circuit diagram and a possible implementation layout of the driver 62 according to the disclosure, which uses a differentiating stage 86 and an integrating driver stage 84.

Although the circuit firstly appears to be more elaborate, it is evident from the implementation layout that the overall space for the circuit in an ASIC is clearly reduced at 800 μm by 650 μm, since the resistor rpd is dispensed with.

The current-mirror circuit 96 of the driver 62 according to the disclosure needs, as evident from the circuit diagram and the implementation layout, two transistors of type nd25a, which are denoted correspondingly by reference code nd25a, and two transistors of type pha. The space for these four transistors is, however, smaller than that of the resistor rpd in the case of the conventional driver circuit, so that the overall space for the circuit is smaller and hence the realisation of multi-mirror arrays 22 with smaller micromirrors 24 is possible.

Concluding Remark

The methods and apparatus described above can, with slight adaptations, also be used in conjunction with EUV lithography systems or other optical systems with several actuators, such as, for example, in the case of a mirror having a surface which is deformed, in which systems a monitoring and drive with a multitude of sensor channels and drive channels is needed.

What is claimed is:

1. An illumination system, comprising:
a multi-mirror array comprising a mirror;
an actuator configured to tilt the mirror; and
drive electronics, comprising:
a coarse digital-to-analogue converter having a first resolution;
an open-loop control unit configured to at least indirectly drive the coarse digital-to-analogue converter, the open-loop control unit is controlled without a control loop;
a fine digital-to-analogue converter having a second resolution which is higher than the first resolution;
a closed-loop control unit configured to at least indirectly drive the fine digital-to-analogue converter; and
an adder configured to add output quantities output by the coarse and fine digital-to-analogue converters to yield an overall quantity that can be applied at least indirectly to the actuator,
wherein the illumination system is configured to be used in a microlithographic projection exposure apparatus.

2. The illumination system according to claim 1, wherein the output quantities are voltages.

3. The illumination system according to claim 2, wherein the coarse digital-to-analogue converter has a first output-voltage range, and the fine digital-to-analogue converter has a second output-voltage range that is smaller than the first output-voltage range.

4. The illumination system according to claim 2, wherein the fine digital-to-analogue converter has a second output-voltage range, and the drive electronics are configured so that a desired total voltage to be applied to the actuator is obtained when a voltage that is output by the fine digital-to-analogue converter lies in the middle of the output-voltage range of the fine digital-to-analogue converter.

5. The illumination system according to claim 2, wherein the fine digital-to-analogue converter has an output-voltage range that is symmetrical about 0 V.

6. The illumination system according to claim 2, wherein the fine digital-to-analogue converter has an output-voltage range that is from approximately −5 V to approximately +5 V.

7. The illumination system of claim 1, wherein the fine and coarse digital-to-analogue converters are configured so that a common digital input signal are applied to them during use.

8. The illumination system of claim 1, wherein the fine and coarse digital-to-analogue converters are configured so that different digital input signals are applied to them during use.

9. The illumination system of claim 1, wherein the coarse digital-to-analogue converter has a non-linear converter characteristic.

10. The illumination system of claim 1, wherein the coarse digital-to-analogue converter has a converter characteristic that corresponds to an inverse function of a function that represents a relationship between a tilt angle of the mirror and the overall quantity applied at the actuator.

11. The illumination system according to claim 1, further comprising a measuring system configured to measure an actual tilting of the mirror,
wherein the measuring system comprises:
a detector configured to detect a pattern; and
a pattern-recognition system configured to search for the detected pattern within a subregion of an overall pattern.

12. The illumination system according to claim 1, wherein the drive electronics comprise a coordinate-transformation unit configured to subject digital information to a transformation of coordinates, the digital information being intended for the coarse digital-to-analogue converter and/or for the fine digital-to-analogue converter.

13. A method, comprising:
providing an illumination system for a microlithographic projection exposure apparatus, the illumination system comprising a multi-mirror array comprising a mirror capable of being tilted via an actuator;
providing a first item of digital information by an open-loop control, the open-loop control is without a control loop;
converting the first item of digital information into a first analogue quantity with a first resolution;
providing a second item of digital information by a closed-loop control;
converting the second item of digital information into a second analogue quantity with a second resolution that is higher than the first resolution;
adding the two analogue quantities to yield an overall quantity; and at least indirectly applying the overall quantity to the actuator.

14. The method according to claim 13, wherein the closed-loop control is a linear regulation system.

15. The method according to claim 13, wherein the closed-loop control operates differently in an adjusting phase and in a holding phase.

16. The method according to claim 13, wherein the information about tilting the mirror is provided by a pattern-recognition system which searches for a pattern in a subregion an overall pattern as a function of the first item of digital information.

17. A method, comprising:
   determining a sampling-rate with which measured values of positions of a plurality of mirrors in a multi-mirror array are measured by a measuring system so that the measured values are present with a variance that lies within a given specification;
   sampling at an N-fold sampling-rate and with correspondingly increased variance, wherein the N-fold sampling-rate is chosen in such a way that aliasing no longer occurs; and
   filtering the measured values that are present at N-fold sampling-rate by averaging, so that filtered values obtained thereby are present with a variance within the given specification.

18. The method according to claim 17, wherein the N-fold sampling-rate is determined in accordance with the Nyquist theorem.

19. An illumination system, comprising:
   a multimirror array comprising a mirror;
   an actuator configured to tilt the mirror; and
   drive electronics configured to generate electrical signals to be applied to the actuator, the drive electronics comprising:
      an integrating driver stage comprising an input; and
      a differentiating stage comprising an output,
   wherein the output of the differentiating stage is connected at least indirectly to the input of the integrating driver stage, and the illumination system is configured to be used in a microlithographic projection exposure apparatus.

20. The illumination system according to claim 19, wherein the integrating driver stage takes up less than 50% of an area of the mirror.

21. The illumination system according to claim 19, wherein the integrating driver stage comprises:
   a) a first and a second absolute-value element each having an input and an output,
   b) an inverter having an input and an output, and
   c) a first and a second adder, each having a first and a second input and an output, wherein:
      the input of the integrating driver stage is connected to the input of the first absolute-value element and the first input of the first adder,
      the output of the first absolute-value element is connected to the second input of the first adder,
      the input of the integrating stage further is connected to the input of the inverter and wherein the output of the inverter is connected to the input of the second absolute-value element and to the first input of the second adder, and
      the output of the second absolute-value element is connected to the second input of the second adder.

22. The illumination system according to claim 21, wherein the integrating driver stage comprises a first and a second voltage-to-current converter each having a driving input and wherein
   a) the driving input of the first voltage-to-current converter is connected with the output of the first adder, and
   b) the driving input of the second voltage-to-current converter is connected with the output of the second adder.

23. The illumination system according to claim 22, wherein the integrating driver stage comprises a current-mirror circuit driven by the first and the second voltage-to-current converters.

24. An apparatus, comprising:
   a differentiating stage configured to differentiate incoming signals and to provide differentiated output signals; and
   an integrating driver stage,
   wherein the apparatus is configured so that, during use of the apparatus:
      an output of the differentiating stage is connected to an input of the driver stage so that the differentiated output signals are sent from the differentiating stage to the integrating driver stage;
      the integrating driver stage is configured to integrate the differentiated output signals received from the differentiating stage; and
      an output of the driver stage is connectable to at least one input of a micro-mirror array comprising a plurality of mirrors to drive the mirrors of the micro-mirror array.

25. A method, comprising:
   providing an illumination system for a microlithographic projection exposure apparatus, the illumination system comprising a multi-mirror array comprising a mirror capable of being tilted via an actuator;
   converting a first item of digital information into a first analogue quantity with a first resolution;
   converting a second item of digital information into a second analogue quantity with a second resolution that is higher than the first resolution;
   adding the two analogue quantities to yield an overall quantity; and
   at least indirectly applying the overall quantity to the actuator;
   wherein the first item of digital information is provided by:
      providing the first item of digital information via an open-loop control as a function of the nominal tilt angle, the open-loop control is without a control loop;
      and, after at least indirectly applying the overall quantity to the actuator, iteratively executing the following:
         measuring an actual tilt angle of the mirror;
         determining a difference between the actual tilt angle and the nominal tilt angle;
         terminating iteration if the difference is smaller than a preset threshold value;
         determining the second item of digital information as a function of the difference;
         converting the second item of digital information into the second analogue quantity;
         adding the two analogue quantities to yield an overall quantity; and
         applying the overall quantity to the at least one actuator.

26. The method according to claim 25, wherein the maximum number of iterative repetitions is limited.

* * * * *

UNITED STATES PATENT AND TRADEMARK OFFICE
CERTIFICATE OF CORRECTION

PATENT NO. : 9,348,232 B2
APPLICATION NO. : 12/797188
DATED : May 24, 2016
INVENTOR(S) : Jan Horn, Christian Kempter and Wolfgang Fallot-Burghardt Page 1 of 1

It is certified that error appears in the above-identified patent and that said Letters Patent is hereby corrected as shown below:

In the specification

Col. 6, line 55, after "sampled", insert -- at --.

Col. 18, line 64, delete "wing" and insert -- owing --.

Signed and Sealed this
Twenty-third Day of August, 2016

Michelle K. Lee
*Director of the United States Patent and Trademark Office*